(12) United States Patent
Kim

(10) Patent No.: US 9,112,365 B2
(45) Date of Patent: Aug. 18, 2015

(54) STANDBY POWER SHUT-OFF OUTLET DEVICE AND A CONTROL METHOD FOR THE SAME

(76) Inventor: Chang-Ho Kim, Seoul (KR)

( * ) Notice: Subject to any disclaimer, the term of this patent is extended or adjusted under 35 U.S.C. 154(b) by 683 days.

(21) Appl. No.: 13/394,422

(22) PCT Filed: Aug. 5, 2010

(86) PCT No.: PCT/KR2010/005156
§ 371 (c)(1),
(2), (4) Date: Mar. 6, 2012

(87) PCT Pub. No.: WO2011/031009
PCT Pub. Date: Mar. 17, 2011

(65) Prior Publication Data
US 2012/0169123 A1     Jul. 5, 2012

(30) Foreign Application Priority Data

Sep. 11, 2009 (KR) .................. 10-2009-0085647
Jan. 19, 2010 (KR) .................. 10-2010-0004960

(51) Int. Cl.
| | |
|---|---|
| *H02J 1/04* | (2006.01) |
| *H02J 9/00* | (2006.01) |
| *H01R 103/00* | (2006.01) |
| *H01H 3/42* | (2006.01) |
| *H01H 13/18* | (2006.01) |
| *H01R 13/703* | (2006.01) |

(52) U.S. Cl.
CPC . *H02J 9/005* (2013.01); *H01H 3/42* (2013.01); *H01H 13/18* (2013.01); *H01R 13/7038* (2013.01); *H01R 2103/00* (2013.01); *H02J 2009/007* (2013.01); *H03K 2217/0036* (2013.01); *Y04S 20/225* (2013.01)

(58) Field of Classification Search
CPC ............... H03K 2217/0036; Y04S 20/225; H02J 9/005
USPC .......................................................... 307/60
See application file for complete search history.

(56) References Cited

U.S. PATENT DOCUMENTS

| | | | |
|---|---|---|---|
| 2007/0262646 A1 | 11/2007 | Lee | |
| 2008/0231121 A1* | 9/2008 | Yang et al. | 307/131 |
| 2009/0102294 A1* | 4/2009 | Hodges et al. | 307/126 |

FOREIGN PATENT DOCUMENTS

| | | |
|---|---|---|
| CN | 1588470 A | 3/2005 |
| CN | 2850053 Y | 12/2006 |
| CN | 1965450 A | 5/2007 |

(Continued)

*Primary Examiner* — Daniel Cavallari
(74) *Attorney, Agent, or Firm* — Jefferson IP Law, LLP

(57) ABSTRACT

An outlet or multi-outlet power strip device for interrupting standby power is provided that includes at least one standby power shut-off unit, which is provided correspondingly to at least one receptacle outlet and either supplies or shuts off power to an electronic product connected to the at least one receptacle outlet depending on the status of the electronic product; an outlet power supply, which receives power from the at least one standby power shut-off unit, and converts and supplies the input power to the outlet; a mode selector, to which a selected mode on whether the outlet should be operated in independent mode or cooperative mode is input; and a controller, which sets a standby current of the electronic product, detects the power status of the electronic product by using the set standby current, and controls the at least one standby power shut-off unit according to the detected power status.

10 Claims, 11 Drawing Sheets

(56) References Cited

FOREIGN PATENT DOCUMENTS

| | | |
|---|---|---|
| CN | 201130780 Y | 10/2008 |
| JP | 2002-125315 A | 4/2002 |
| JP | 2002-186178 A | 6/2002 |
| JP | 2006-288020 A | 10/2006 |
| KR | 10-2007-0082132 A | 8/2007 |
| KR | 10-2008-0085617 A | 9/2008 |
| KR | 10-0871672 B1 | 12/2008 |
| KR | 10-2009-0052275 A | 5/2009 |
| KR | 10-2009-0093569 A | 9/2009 |
| WO | 2009-075545 A2 | 6/2009 |

* cited by examiner

STANDBY POWER SHUT-OFF OUTLET DEVICE AND A CONTROL METHOD FOR THE SAME

TECHNICAL FIELD

The present invention relates to an outlet apparatus or a multi-tap apparatus, and more particularly to an outlet apparatus or a multi-tap apparatus having a function of interrupting standby power.

BACKGROUND ART

In general, conventional consumer electronics consume a predetermined amount of standby power when they are plugged into a wall outlet or a multi-tap (or multi-outlet) although they are not being used, which wastes power and creates a risk of fire. At this time, the standby power refers to power continuously consumed by consumer electronics while the consumer electronics are plugged in but switched off.

The standby power is called vampire power in advanced countries as it was recognized as the main culprit of power consumption from 2 to 3 years ago. Further, the consumption of standby power becomes a subject to be actively removed as awareness of the importance of energy and the environment has been raised.

Products such as a VCR, a TV, a microwave, a dishwasher, and a cellular phone charger consume much more power in a standby state where they do not perform their functions while being connected to a power source than they do in a state where they perform their functions.

In order to interrupt the standby power, a switch is attached to an outlet or a multi-tap. When the products are not used, the switch is turned to "off" and then the standby power is interrupted. When a user desires to use the products, the user can use it after turning the switch to "on". However, the outlet or the multi-tap is often located in an inconspicuous place such as behind furniture or under a desk. Accordingly, the user should crawl under the desk or put his/her hand behind the furniture in order to control a power cut-off switch, which makes the user feel inconvenience.

As described above, since there is the cumbersomeness to turn "on" or "off" a power source of the outlet or the multi-tap for every use of the electronic product, most users usually do not turn "off" the switch while not using the electronic product, so that the waste of the standby power is still generated and coasts of the product with the switch will be increased due to the inclusion of the switch. As a result, the switch has no effect.

Further, in order to remove the inconvenience, conventional arts disclose a method of automatically interrupting standby power and turning "on" the outlet by using a remote control through an infrared receiver installed in the outlet or a wireless receiving unit when power is supplied to the electronic product. However, the method also has cumbersomeness in finding the remote control and then turning "on" the power source when the user desires to use the electronic product. Also, in a case of an infrared remote control, the space where the infrared remote control can be used is limited.

Furthermore, there is a disadvantage of generating standby power in the outlet or the multi-tap itself and a problem of increasing costs according to the complexity of a circuit because there is required a power source for a control in order to receive a control signal of the remote control. Therefore, a method, which solves the above-mentioned problem and efficiently interrupts standby power at the same time, is highly required.

DISCLOSURE

Technical Problem

The present invention provides an outlet apparatus having a function of automatically interrupting standby power.

Further, the present invention provides an outlet apparatus for automatically interrupting standby power according to a state of a power source of an electronic product connected to one or more outlet inserters.

Furthermore, the present invention provides an outlet apparatus, which is operated in an independent mode or an interworking mode and automatically interrupts standby power consumed within not only the electronic product connected to the outlet apparatus but also the outlet apparatus.

Technical Solution

In accordance with an aspect of the present invention, there is provided an outlet apparatus for interrupting standby power, including one or more standby power interrupters for interrupting external power or supplying the external power to an electronic product connected to one or more outlet inserters, the one or more standby power interrupters being installed to correspond to the one or more outlet inserters, respectively; an outlet power source unit for converting external power input from the one or more standby power interrupters and supplying the converted external power to an inside of the outlet apparatus; a mode selector for receiving an input of a selection mode for operating the outlet apparatus with an independent mode or an interworking mode; and a controller for individually setting a standby current of the electronic product connected to the one or more outlet inserters, determining a state of a power source of the electronic product connected to the one or more outlet inserters by using the set standby current, and controlling the one or more standby power interrupters according to the determined state of the power source.

Advantageous Effects

The outlet apparatus according to the present invention can automatically interrupt standby power consumed within not only the electronic product but also the outlet. Also, the outlet apparatus can efficiently interrupt standby power consumed in the electronic product according to a state of a power source of the electronic product connected to one or more plug inserters.

Further, the user can conveniently operate the outlet apparatus by directly or remotely using a remote switch unit installed in an outside of the outlet. Also, when power sources of all electronic products connected to the outlet apparatus are in an "off" state, the outlet apparatus is operated in a sleep mode and thus power consumed in the outlet may be minimized.

BRIEF DESCRIPTION OF THE DRAWINGS

The foregoing and other objects, features and advantages of the present invention will become more apparent from the following detailed description when taken in conjunction with the accompanying drawings in which.

BEST MODE

Mode for Invention

In the following description, detailed explanation of known related functions and constitutions may be omitted to avoid unnecessarily obscuring the subject manner of the present invention. Further, the terms used in the description are defined considering the functions of the present invention and may vary depending on the intention or usual practice of a user or operator. Therefore, the definitions should be made based on the entire contents of the description.

Embodiments of the present invention provide an outlet apparatus and a method of controlling the same, which can completely interrupt standby power and can be conveniently operated by a user. In the detailed description of the present invention, an outlet apparatus will be described for illustration, but it will be apparent to those skilled in the art that the present invention may be applied to a multi-tap similar to the outlet apparatus.

Hereinafter, an outlet apparatus and a method of controlling the same according to exemplary embodiments of the present invention will be described with reference to the drawings in detail.

First Embodiment

Figure 1:
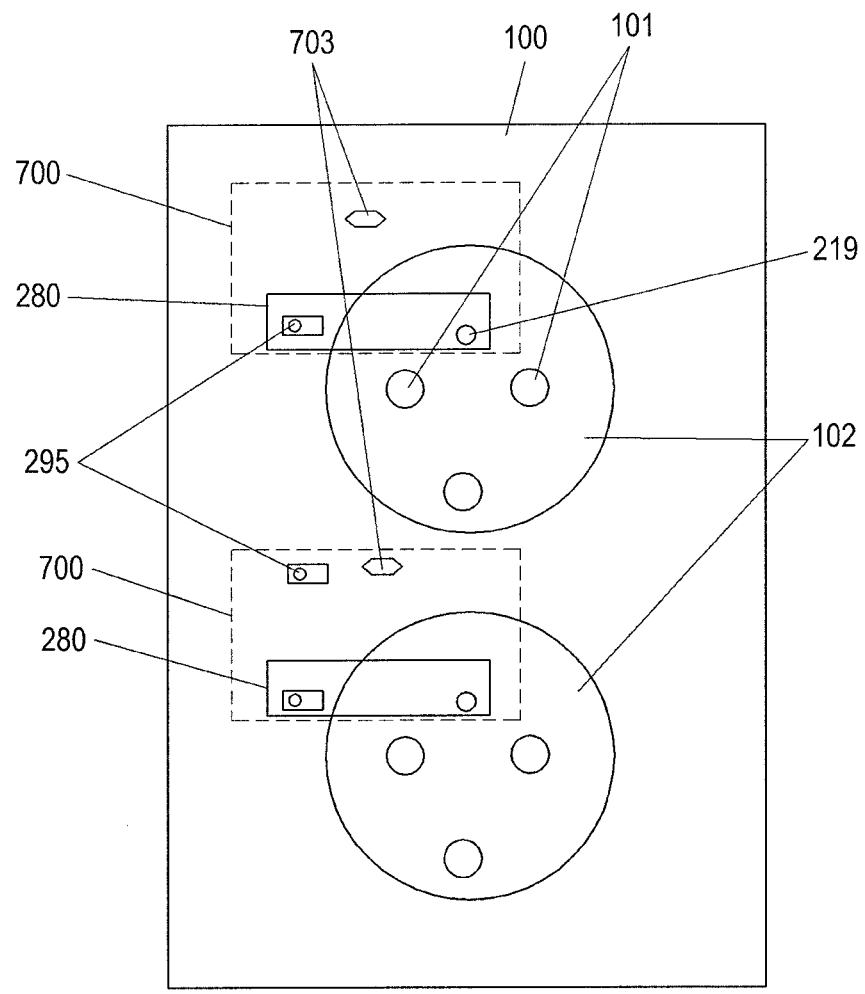
FIG. 1 is a diagram illustrating an outside of an outlet according to a first embodiment of the present invention.

FIG. 1 is a diagram illustrating an outside of an outlet according to a first embodiment of the present invention.

Referring to FIG. 1, an outlet 100 includes one or more plug inserters 102 and one or more standby power interrupters 700. Here, the outlet 100 includes one standby power interrupter 700 corresponding to one plug inserter 102.

The standby power interrupter 700 includes a controller 701, an outlet power source unit 702, a jumper 703, a memory 704, an outlet switch unit 280, a current transformer 705, and a switch driver 706, and the plug inserter 102 includes a plug inserting hole 101.

The standby power interrupter 700 performs an operation of automatically interrupting standby power according to a state of an electronic product connected to the outlet 100. That is, the controller 701 of the standby power interrupter 700 measures a current flowing in an inside of the electronic product connected to the outlet 100 and determines whether a power source of the electronic product is in an "on" state or an "off" state.

When the power source of the electronic product is in an "off" state, the standby power interrupter 700 controls the outlet switch unit 280 and completely interrupts power supplied to an inside of the electronic product and power supplied to an inside of the outlet 100. Thereafter, when a user desires to turn "on" the power source of the electronic product, the user operates the outlet switch unit 280 to supply power to the inside of the electronic product.

Hereinafter, an operation of the outlet switch unit 280 will be described with reference to the drawings in detail.

FIGS. 2 to 6 illustrate a construction and an operation of the outlet switch unit according to a first embodiment of the present invention.

Figure 2:
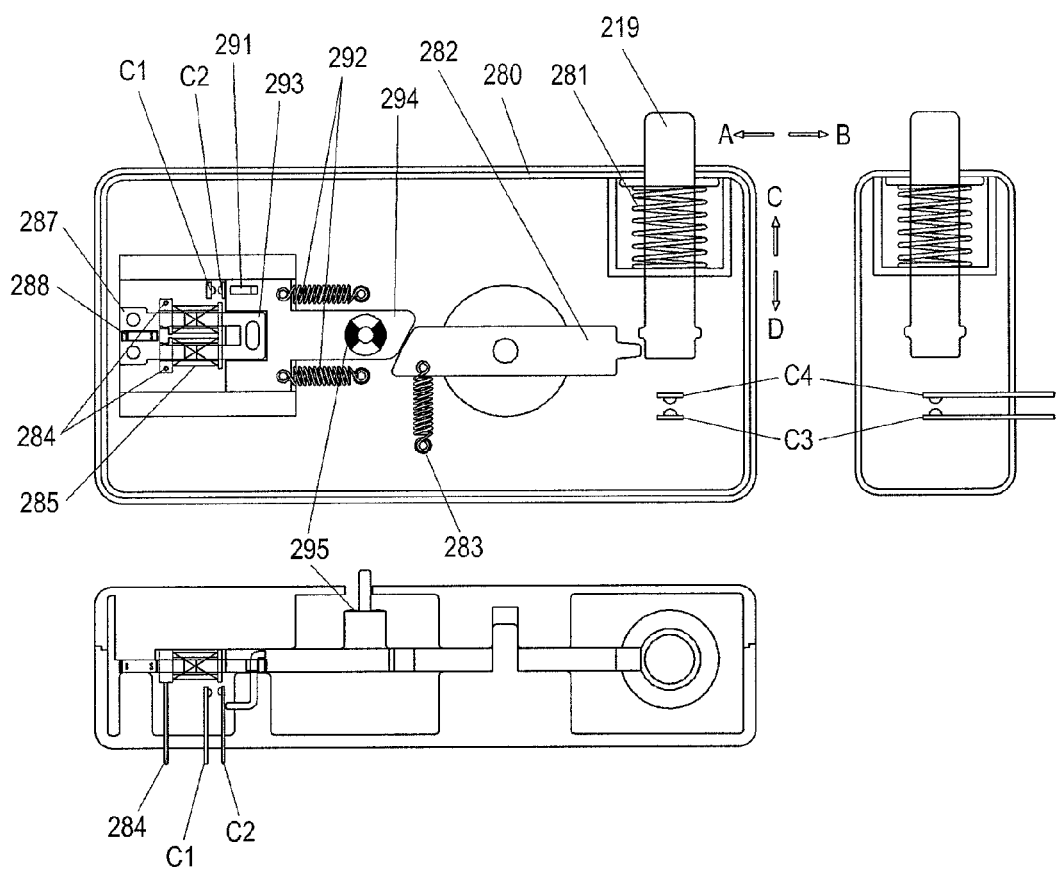
FIGS. 2 to 6 illustrate a construction and an operation of an outlet switch unit according to a first embodiment of the present invention.

Referring to FIG. 2, the outlet switch unit 280 includes a knob (or a knob switch) 219, a knob spring 281, a lever 282, a lever spring 283, a solenoid coil terminal 284, a contact 1 C1, a contact 2 C2, a core 287, a magnet 288, a solenoid coil 285, a stroke 291, a cam 294, a slide 293, a cam spring 292, a cam knob 295, a contact 3 C3, and a contact 4 C4. Here, the cam 294, the slide 293, the stroke 291, and the cam knob 295 may be integrally constructed.

When a plug of the electronic product is not connected to the outlet 100, the contacts C1 and C2 of the outlet switch unit 280 and the contacts C3 and C4 of the outlet switch unit 280 are in a separated state as shown in FIG. 2. In this case, there is no standby power consumed in the outlet because external power supplied to the inside of the outlet 100 is completely interrupted.

Figure 3:
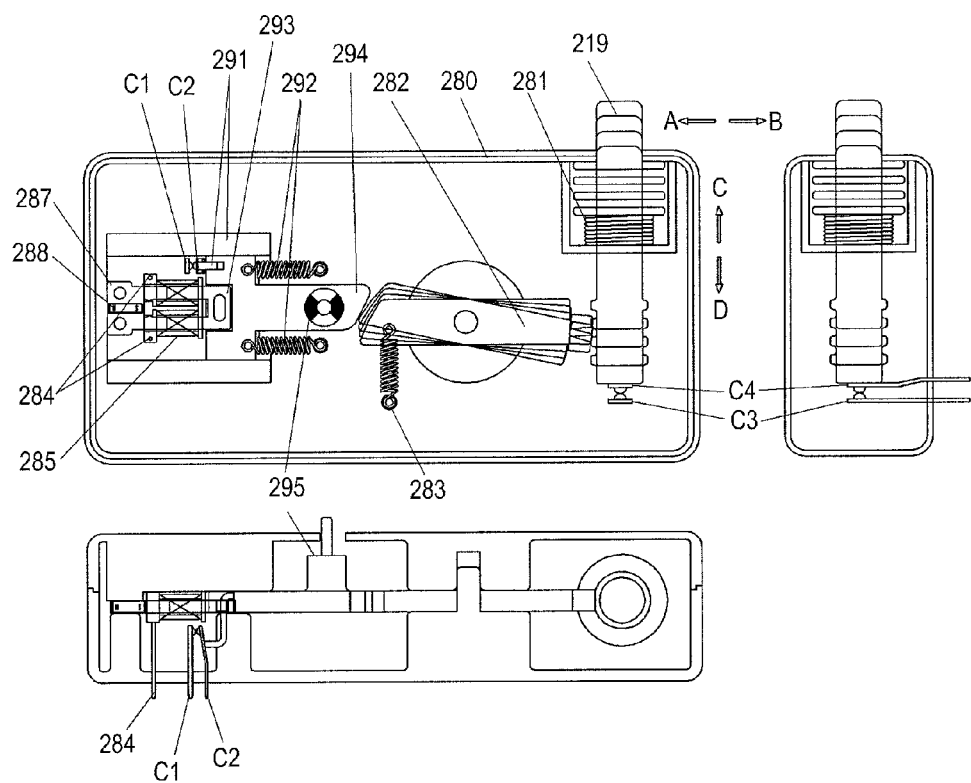

FIG. 3 illustrates an operation of the outlet switch unit 280 when the plug of the electronic product is inserted into the outlet 100. Referring to FIG. 3, when the plug of the electronic product is inserted into the outlet 100, the plug presses the knob 219 in a direction D. Accordingly, the knob 219 downwardly pushes the lever 282 and thus the lever 282 rotates in a clockwise direction and upwardly pushes the cam 294 located in an opposite side of the lever 282. Therefore, the slide 293 integrally constructed with the cam 294 is moved in a direction A. At this time, the cam spring 292 is pushed in the direction of A.

The core 287 integrally constructed with the magnet 288 pulls the slide 293 having moved in the direction A with magnetic force. When the core 287 and the slide 293 are attached to each other, the stroke 291, which is integrally constructed with the cam 294 and formed of an insulation material, is moved in the direction A and connects the contact 1 C1 and the contact 2 C2. When the plug of the electronic product is completely inserted into the outlet 100, the knob 219 connects the contact 3 C3 and the contact 4 C4.

Figure 4:
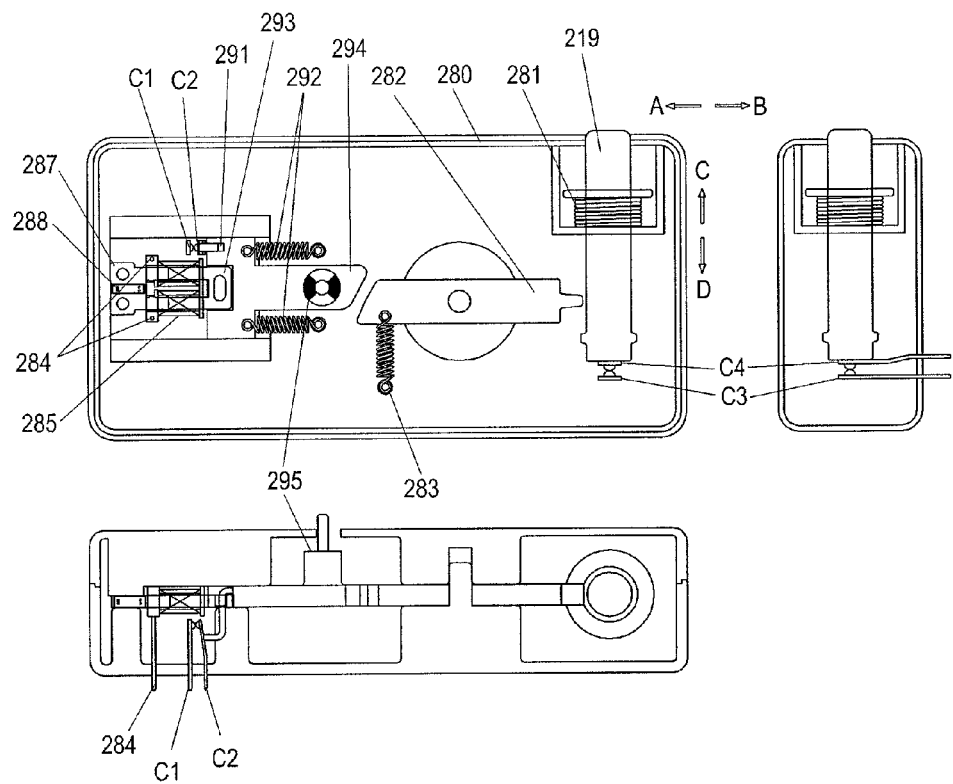

FIG. 4 illustrates a state of the outlet switch unit 280 when the plug of the electronic product is completely inserted into the outlet 100. The contacts 1 and 2 C1 and C2 are connected to each other and the contacts 3 and 4 C3 and C4 are connected to each other and thus power is supplied to the inside of the electronic product. Further, since a jaw of the lever 282 is located above a jaw of the knob 219 in the outlet switch unit 280, the cam 294 may have a space to move in a direction B even when the plug is completely inserted into the outlet 100.

Figure 5:
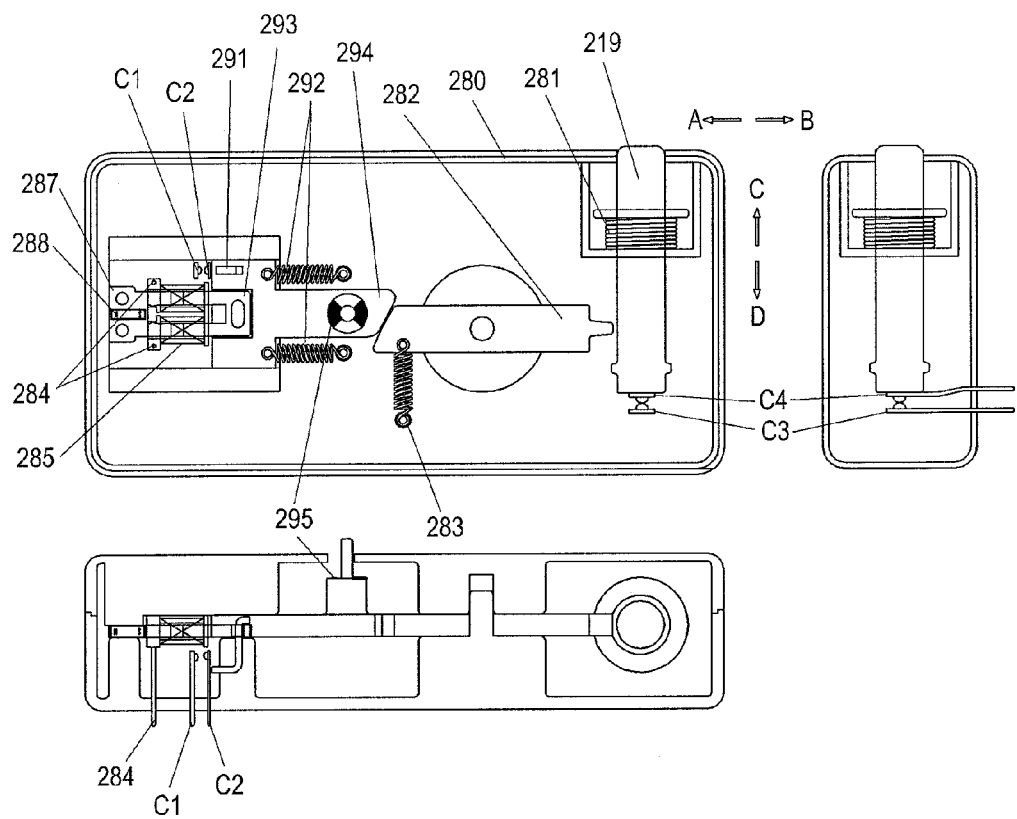

FIG. 5 illustrates an operation of the outlet switch unit 280 when a power source of the electronic product is in an "off" state.

When the power source of the electronic product is in an "off" state while the plug of the electronic product is connected to the outlet 100, a standby current flows in the inside of the electronic product. At this time, the controller 701 determines whether the current flowing in the inside of the electronic product is a standby current. When it is determined that the current flowing in the inside of the electronic product is the standby current, the controller 701 controls such that power is supplied to the solenoid coil terminal 284 of the outlet switch unit 280.

When power is supplied to the solenoid coil terminal 284, the solenoid becomes an electromagnet and generates a repulsive force with the magnet 288. Accordingly, the slide 293 attached to the core 287 is moved in a direction B by the cam spring 292 due to the repulsive power from the magnet 288. The cam 294 integrally constructed with the slide 293 is also moved in the direction B and thus the stroke 291 is returned to an original position. When the stroke 291 is returned to the original position, the contact 1 C1 is separated from the contact 2 C2 and AC power supplied to the inside of the electronic product is interrupted.

Accordingly, external power supplied to the inside of the outlet 100 is interrupted in a state where the plug of the electronic product is connected to the outlet 100, so that standby power consumed within not only the electronic product but also the outlet 100 may be completely interrupted.

In the above state, when it is desired to supply power again in the inside of the electronic product, if the cam knob 295 is pushed in the direction A, the contact 1 C1 and the contact 2 C2 are connected to each other and then power is supplied to the electronic product.

Figure 6:
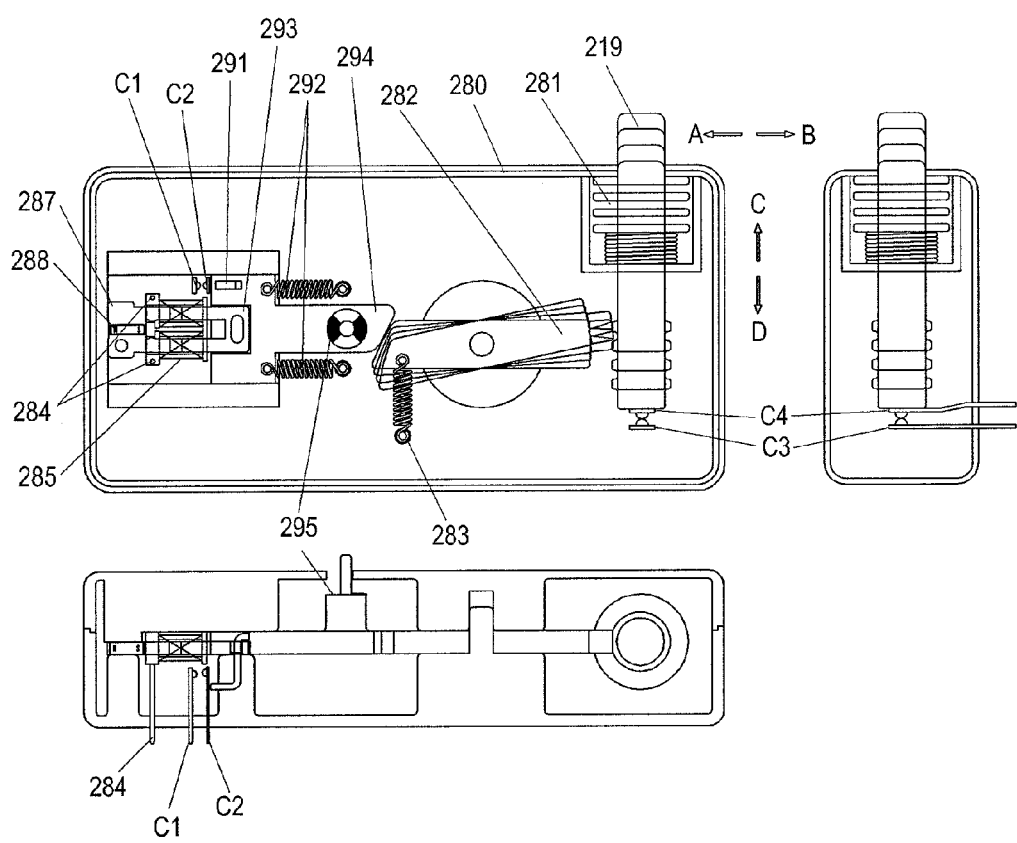

FIG. 6 illustrates an operation of the outlet switch unit 280 when the plug of the electronic product is separated from the outlet.

When the plug is separated from the outlet 100, the knob 219 is moved in a direction C by the knob spring 281. At this time, the knob 219 upwardly raises the lever 282 and moves the lever 282 in a counterclockwise direction. An opposite side of the lever 282 is downwardly moved and the lever 282 is returned to an original state shown in FIG. 2 without touching the cam 294. At this time, the contact 3 C3 and the contact 4 C4 are separated from each other.

Hereinafter, a construction and an operation of a standby power interrupter 700 including the aforementioned outlet switch unit 280 will be described with reference to the drawings in detail.

Figure 7:
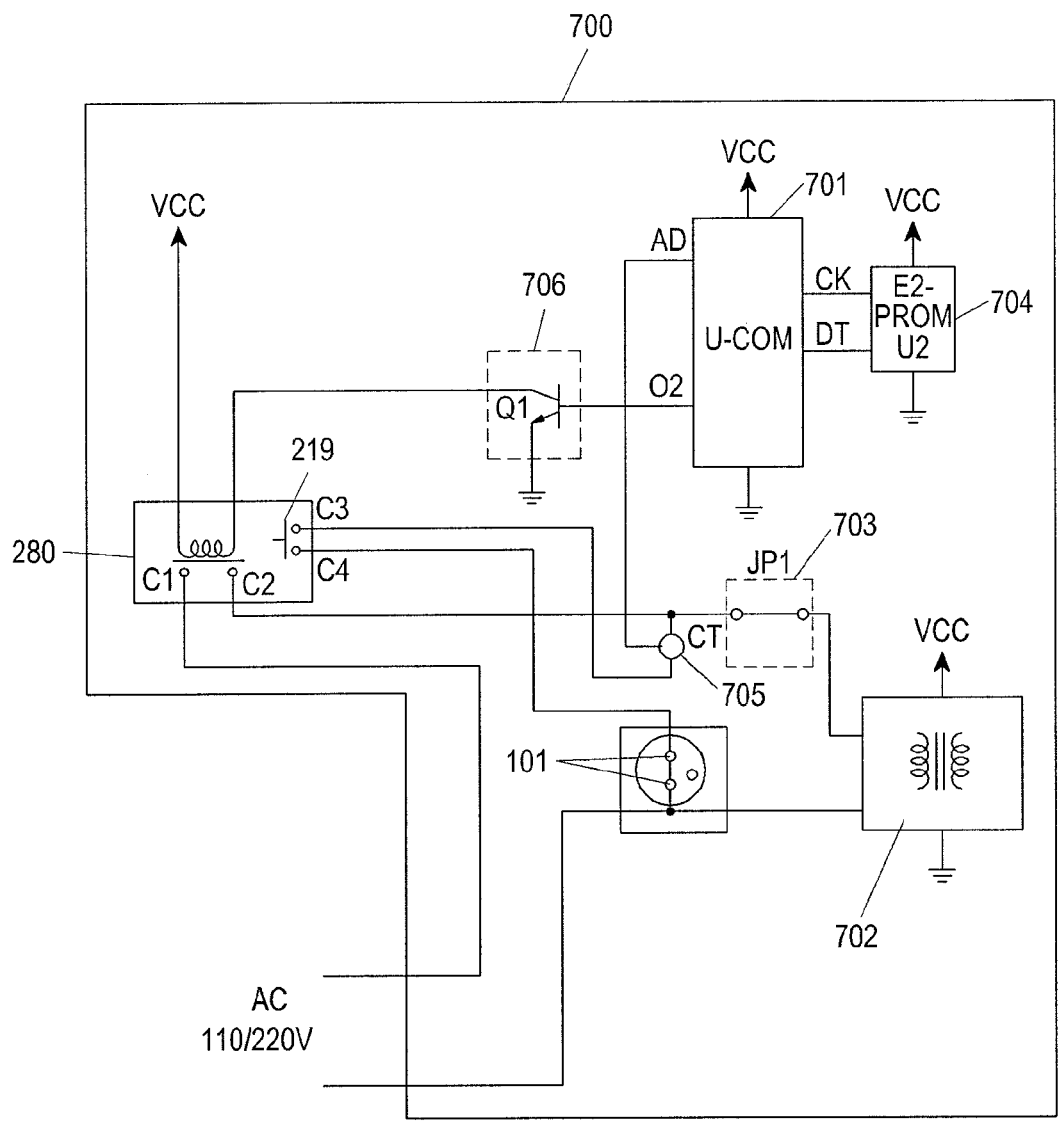
FIG. 7 is a diagram illustrating a standby power interrupter 700 according to a first embodiment of the present invention.

FIG. 7 is a diagram illustrating a standby power interrupter 700 according to a first embodiment of the present invention.

Referring to FIG. 7, the standby power interrupter 700 includes a controller 701, an outlet power source unit 702, a jumper (JP1) 703, a memory 704, the outlet switch unit 280, a current transformer 705, and a switch driver 706.

The controller 701 measures a current flowing in the inside of the electronic product and inspects whether a power source of the electronic product is in an "on" state or an "off" state. When the power source of the electronic product is in an "off" state, the controller 701 controls the outlet switch unit 280 in order to interrupt standby power consumed in the electronic product.

The outlet switch unit 280 plays a role of supplying power to insides of the electronic product and the outlet apparatus 100 or interrupting power though the operation of the controller 701 or by a user. The user can supply and interrupt power by turning "on" or "off" the outlet switch unit 280, but the controller 701 can only interrupt power because the controller 701 can only turn "off" the outlet switch unit 280.

The current transformer 705 measures a current flowing in the inside of the electronic product connected to the outlet 100 and provides the measured current to the controller 701.

The memory 704 stores a standby current flowing in the inside of the electronic product connected to the outlet 100. It is illustrated that an EEPROM is used as the memory 704 in embodiments of the present invention, but it will be apparent to those skilled in the art that other types of the memory may be used.

The switch driver 706 supplies a current to the outlet switch unit 280 under a control of the controller 701. The outlet power source unit 702 supplies power to drive a circuit within the outlet 100.

The jumper 703 is connected between the outlet switch unit 280 and the outlet power source unit 702 to perform a function of interrupting power supplied to the outlet power source unit 702. That is, when a product having no standby power or a product continuously operated is used in the future, it is not necessary to operate the circuit within the outlet 100, so that the jumper 703 is separated and power supplied to the outlet power source unit 702 is interrupted.

Hereinafter, an overall operation of the standby power interrupter 700 will be described.

First, when the plug of the electronic product is inserted into the outlet plug inserting hole 101, the inserted plug presses the knob 219 of the outlet switch unit 280 and thus connects the contact C3 and the contact C4. Further, as described above, when the lever 282 hits the cam 294 and thus the contact C1 and the contact C2 are connected, power is applied to the electronic product through the outlet 100. At this time, the power is also applied to the outlet power source unit 202 and the outlet power source unit 702 supplies the power to the controller 701 and the memory within the outlet 100.

The current transformer 705 measures a standby current of the electronic product connected to the outlet and provides the measured standby current to the controller 701 in a state where a power source of the electronic product is in an "off" state and only the plug is connected to the outlet. The controller 701 stores a value measured by the current transformer 705 in the memory 704. Accordingly, the outlet 100 can automatically remember a standby current of the electronic product connected to the outlet without the need of remembering a standby current corresponding to each electronic product in advance.

Further, the controller 701 determines whether the standby current consumed in the electronic product is maintained for a predetermined time. The reason of the determination is to automatically interrupt the standby current when the electronic product is not used in a state where the plug of the electronic product is inserted into the outlet. Therefore, when the standby current is maintained for the predetermined time, the controller 701 turns "off" the outlet switch unit 280 and automatically interrupts the standby current.

When a power source of the electronic product is turned "on", the current transformer 705 measures a current flowing in the inside of the electronic product and provides the measured current to the controller 701. In general, the measured current is larger than a standby current stored in the memory 704, so that the controller 701 continuously supplies power to the electronic product.

Meanwhile, when the power source of the electronic product is turned "off", the current measured by the current transformer 705 becomes equal to the standby current stored in the memory 704. Accordingly, the controller 701 reads a value of the current measured by the current transformer 705 and can identify that the power source of the electronic product is turned "off".

At this time, the controller 701 outputs an output of O2 with a "high" pulse and provides it to the switch driver 706. A transistor of Q1 of the switch driver 706 is turned "on" and then power is supplied to the solenoid terminal 287 of the outlet switch unit 280. As described above, when power is supplied to the outlet switch unit 280, the solenoid generates a repulsive force with the magnet 288 and returns the slide 293 to an original position, which makes the contact C1 and the contact C3 separated. When the contact C1 and the contact C2 of the outlet switch unit 280 are separated from each other, power entering the inside of the outlet is interrupted, so that not only standby power in the inside of the electronic product but also standby power in the inside of the outlet are completely interrupted.

When a user desires to use the electronic product again in the future, if the user pushes the cam knob 295 of the outlet switch unit 280 in a direction A, the contact C1 and the contact C2 are connected due to attraction between the slide 293 and the magnet 288. Accordingly, external power is supplied again to the inside of the electronic product. Here, a position of the cam knob 295 can express whether the outlet 100 is in a state where the standby power is interrupted.

As described above, the outlet according to the present invention can automatically interrupt standby power when the power source of the electronic product is turned "off". Accordingly, it is possible to remove cumbersomeness generated in interrupting standby power by directly turning "on" or "off" a switch attached to the conventional outlet or multi-tap. Further, when the power source of the electronic product is turned "off", standby power consumed in the circuit within the outlet may also be interrupted.

Figure 8:
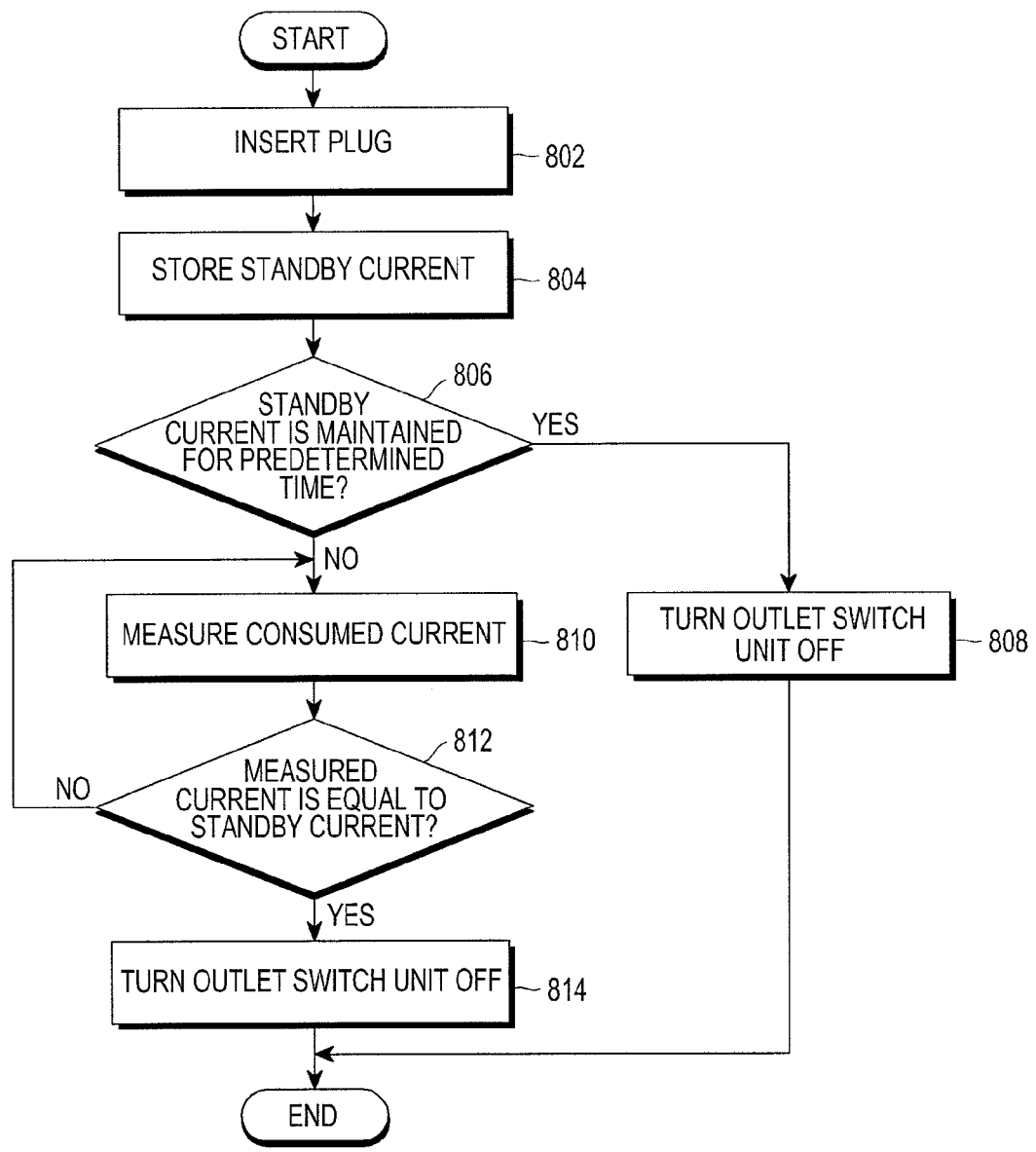
FIG. 8 is a flowchart illustrating a control of an outlet according to a first embodiment of the present invention.

FIG. 8 is a flowchart illustrating a control of an outlet according to a first embodiment of the present invention.

Referring to FIG. 8, when the user desires to use the electronic product, the user inserts the plug of the electronic product into the outlet in step S802. Next, the outlet measures a standby current flowing in the inside of the electronic product and stores the measured standby current in the memory in step S804.

In step S806, the outlet determines whether the standby current is maintained for a predetermined time. The reason of the determination is to interrupt the standby current when a power source of the electronic product is in an "off" state and the electronic product is not used while the plug of the electronic product is inserted into the outlet.

Next, when the standby current is maintained for the predetermined time, the outlet turns "off" the outlet switch unit and interrupts the standby current in step S808. When the standby current is not maintained for the predetermined time, that is, when the power source of the electronic product is turn "on" within the predetermined time, the outlet measures a current consumed in the inside of the electronic product in step S810.

When the electronic product is normally operated and then a power source of the electronic product is turned "off", the consumed current measured in the electronic product becomes equal to the standby current. Accordingly, it is determined whether the current measured by the outlet is equal to a pre-stored standby current in order to determine whether the power source of the electronic product is in an "on" state or an "off" state in step S812.

When the measured current is equal to the standby current, that is, when the power source of the electronic product is turned "off", the outlet switch unit is turned "off" in step S814 and thus standby power consumed in insides of the electronic product and the outlet apparatus are interrupted. Meanwhile, when the measured current is not equal to the standby current, a current consumed in the inside of the electronic product is measured in step S810.

As described above, the outlet controlling method according to the present invention can automatically interrupt standby power consumed in not only the electronic product but also the outlet.

Second Embodiment

Figure 9:
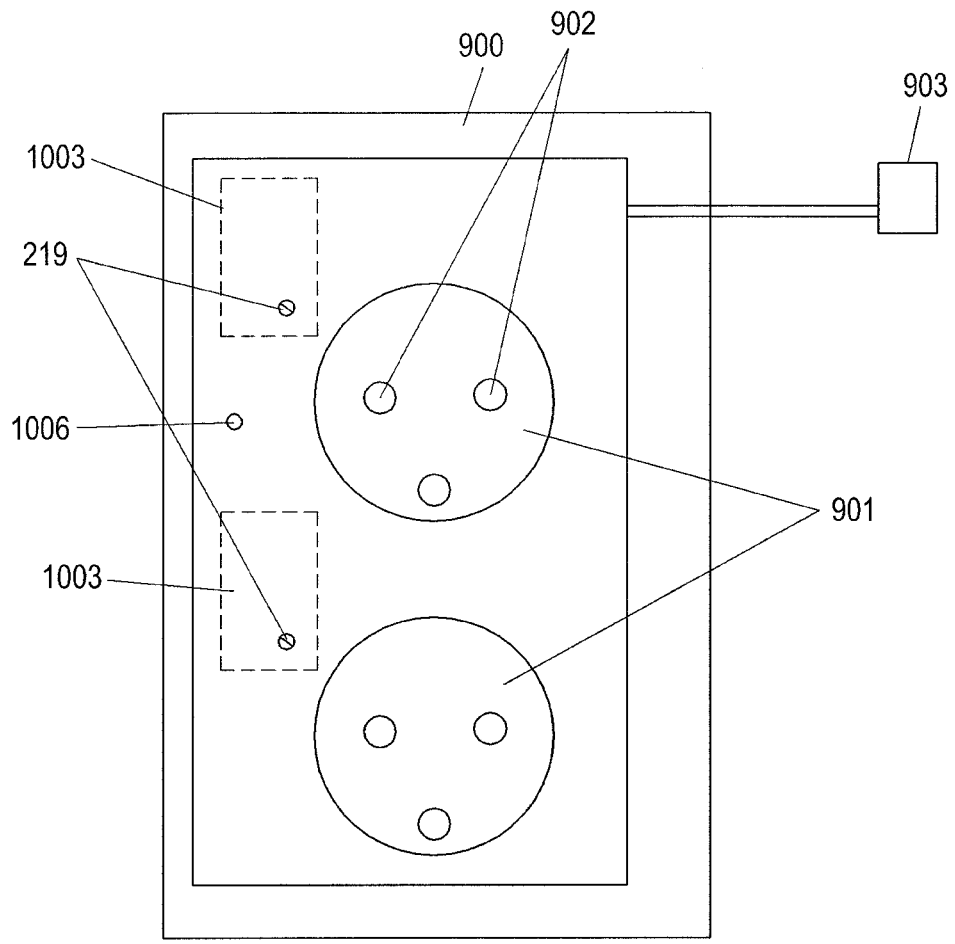
FIG. 9 is a diagram illustrating an outside of an outlet according to a second embodiment of the present invention.

FIG. 9 is a diagram illustrating an outside of an outlet according to a second embodiment of the present invention.

Referring to FIG. 9, an outlet 900 includes one or more plug inserters 901 and one or more standby power interrupters 1003. Here, the outlet 900 includes one standby power interrupter 1003 corresponding to one plug inserter 901. Further, the outlet 900 may further include a remote switch unit 903 installed in a place allowing an easy access by a user.

Figure 10:
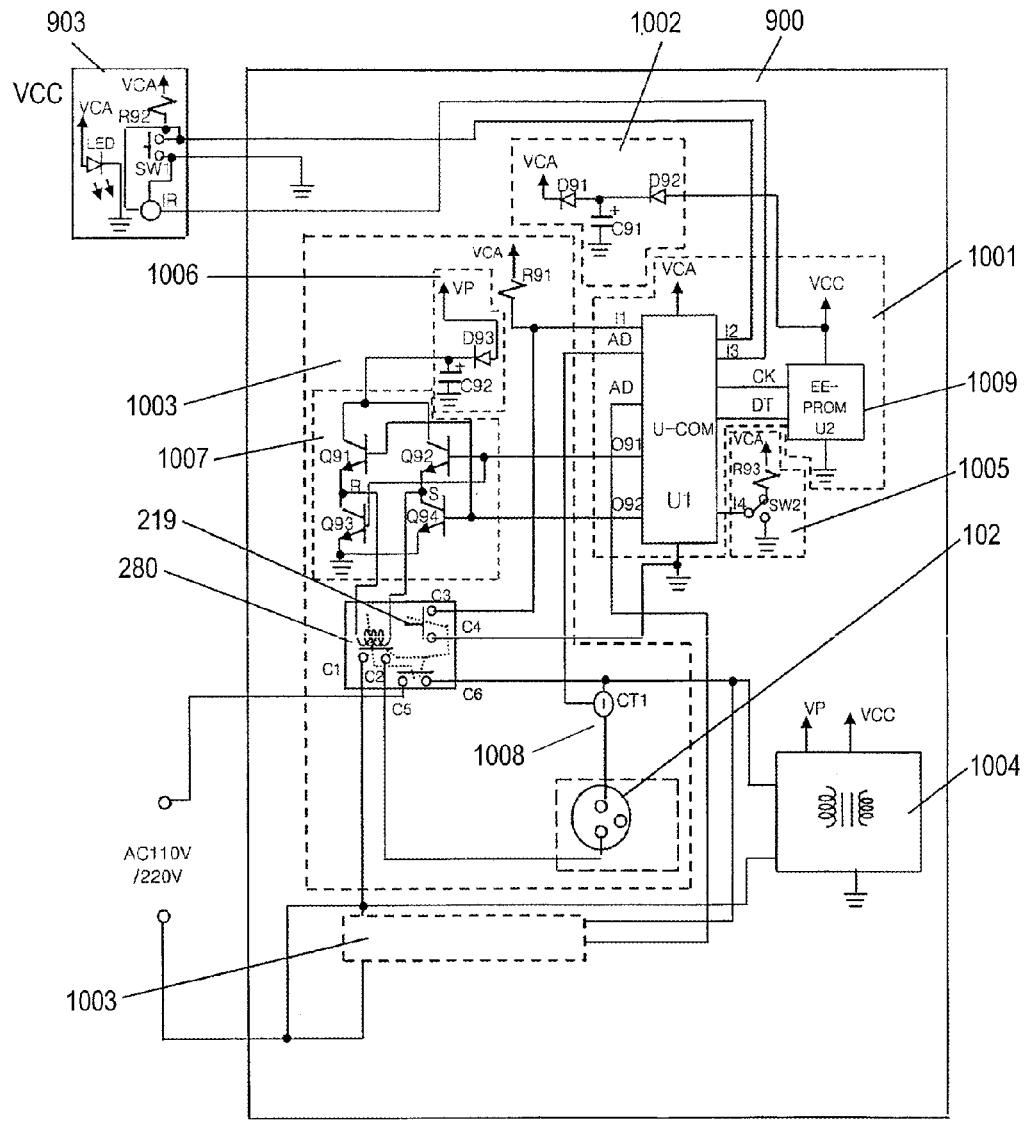
FIG. 10 is a diagram illustrating an inside of an outlet according to a second embodiment of the present invention.

FIG. 10 is a diagram illustrating an inside of an outlet according to a second embodiment of the present invention.

Referring to FIG. 10, the outlet 900 includes a controller 1001, a backup power source unit 1002, one or more standby power interrupters 1003, an outlet power source unit 1004, and a mode selector 1005, and may further include the remote switch unit 903 in an outside of the outlet 900.

The controller 1001 may include a memory 1009 in an inside or an outside of the controller 1001, and one or more standby power interrupters 1003 includes a switch driving power source unit 1006, a switch driver 1007, the outlet switch unit 280, and a sensor unit 1008.

The controller 1001 measures a current flowing in the inside of the electronic product connected to the outlet 900 and inspects whether a power source of the electronic product is in an "on" state or an "off" state. When the power source of the electronic product is in an "off" state, the controller 1001 controls the standby power interrupter 1003 in order to interrupt standby power consumed in the electronic product.

The standby power interrupter 1003 performs a function of supplying power to insides of the electronic product and the outlet 900 or interrupting the power by an operation of the controller 1001 or a user.

Specifically, the outlet switch unit 280 of the standby power interrupter 1003 performs a function of supplying power to the corresponding plug inserter 901 or outlet power source unit 1004 or interrupting the power. That is, when the user presses the knob switch 219, the contacts C1 and C2, the contacts C3 and C4, and contacts C5 and C6 are connected and thus power is supplied to the plug inserter 901. Meanwhile, when the power source of the electronic product connected to the outlet 900 is turned "off" and thus a standby current is detected by the controller 1001, the outlet switch unit 280 interrupts power supplied to the plug inserter 901 and the outlet power source unit 1004.

The switch driver 1007 supplies a current to drive the outlet switch unit 280 by a control of the controller 1001. Further, the switch driving power source unit 1006 supplies power to drive the switch driver 1007.

The sensor unit 1008 measures a current flowing in the inside of the electronic product connected to the outlet 900 and provides the measured current to the controller 1001. The memory 1009 stores the standby current of the electronic product measured by the sensor unit 1008. It is illustrated that an EEPROM is used as the memory 704 in embodiments of the present invention, but it will be apparent to those skilled in the art that other types of the memory may be used.

In embodiments of the present invention, there are two methods of setting a standby current of a corresponding electronic product to the memory 1009 and the methods will be discussed in the following description.

A first method corresponds to a method of passively setting a standby current by a user.

Consumed standby currents are different according to an electronic product connected to one or more plug inserters 901. Accordingly, it is required to separately set a standby current for each electronic product connected to the one or more plug inserters 901. Accordingly, the user inserts a plug of the electronic product into the outlet 900 in a state where the power source of the electronic product is turned "off" and then lengthily presses the knob 219 of the outlet switch 280.

That is, when the user connects the contact C3 and the contact C4 by pressing the knob 219 of the outlet switch unit 280 for a preset time, an input of I1 of the controller 1001 is maintained for a predetermined time in a low state.

The controller 1001 recognizes that the user desires to set the standby current through input information. At this time, the sensor unit 1008 measures the standby current of the corresponding electronic product and provides the measured standby current to the controller 1001. The controller 1001 stores a measured value provided by the sensor unit 1008 in the memory 1009 and then uses the measured value as a reference to determine whether the power source of the electronic product is turned "off" in the future.

A second method corresponds to a method of automatically setting a standby current by the outlet 900.

When power is supplied by inserting a plug of the electronic product to be used into the one or more plug inserters 901 and pressing the knob 219 of the outlet switch unit 280, the sensor unit 1008 measures a current consumed in the inside of the electronic product. Here, the sensor unit 1008 measures the current consumed in the inside of the electronic product regardless of a state of the power source of the electronic product.

The controller 1001 temporarily stores a current value measured by the sensor unit 1008 in a buffer and monitors whether the current value is increased, decreased, or maintained. When the current value is increased, the controller 1001 maintains data stored in the buffer without any change. When the current value is decreased, the controller 1001 replaces the data stored in the buffer with the decreased current value and stores the replaced current value because the smallest current value among current values consumed in the electronic product connected to the plug inserter 901 corresponds to the standby current.

Thereafter, when the data recorded in the buffer of the controller 1001 is maintained for a predetermined time without any change, a current value recorded in the buffer is set as a standby current of the electronic product connected to the plug inserter 901. The controller 1001 stores the current value stored in the buffer in the memory 1009 and then uses the current value as a reference to determine whether a power source of the electronic product is turned "off" in the future.

Meanwhile, when the power source of the electronic product is turned "off" and then turned "on", the controller 1001 reads a standby current lastly stored in the memory 1009 and temporarily stores the standby current in the buffer. Next, the controller measures a current consumed in the electronic product and determines whether the measured current value is equal to the current value stored in the buffer.

When the measured current value is equal to the current value stored in the buffer, the controller 1001 determines that the electronic product is the same electronic product before the electronic product is turned "on". Accordingly, the controller 1001 determines that the current value stored in the buffer as a standby current and maintains the value stored in the memory 1009 without any change.

When the measured current value is larger or smaller than the current value stored in the buffer, the controller determines that the electronic product connected to the outlet 900 is different from the electronic product before the electronic product is turned "on". At this time, the controller 1001 monitors whether the current value measured by the sensor unit 1008 is increased, decreased, or maintained. When the current value is increased, the controller 1001 maintains data stored in the buffer without any change. When the current value is decreased, the data stored in the buffer is replaced with the decreased current value and the replaced current value is stored.

Thereafter, when the current value stored in the buffer is maintained for a predetermined time without any change, the controller 1001 stores the current value recorded in the buffer in the memory 1009 and then uses the current value as a reference to determine whether the power source of the electronic product is turned "off" in the future.

When the one or more standby power interrupters 1003 is turned "on" and thus power is supplied to the corresponding plug inserter 901 and outlet power source unit 1004, the outlet power source unit 1004 supplies power to drive an internal circuit of the outlet 900.

Meanwhile, when all the standby power interrupters 1003 included in the outlet 900 are turned "off" and thus power supplied to all the plug inserters 901 and the outlet power source unit 1004 is interrupted, the backup power source unit 1002 supplies backup power to drive the internal circuit of the outlet 900. Next, when the one or more standby power interrupters 1003 are turned "on" again, the outlet power source unit 1004 recharges the backup power source unit 1002.

Further, when power sources of electronic products connected to the one or more plug inserting holes 102 are in an "off" state, the controller 1001 can operate in a sleep mode in order to minimize power consumed in the inside of the outlet 900. That is, the controller can minimize power consumed in the backup power source unit 1002 through an operation on a predetermined period.

When power is supplied to the electronic product through the remote switch unit 903 or the outlet switch unit 280 while the controller 1001 is operated in a sleep mode, the controller 1001 is converted to a normal mode. Meanwhile, in order to prevent a super capacitor C91 of the backup power source unit 1002 from being discharged in a state of the sleep mode, the controller 1001 can control such that the capacitor is charged on a predetermined time period after inspecting a discharge time in advance.

The mode selector 1005 performs a function of selecting whether the outlet 900 is to be operated in an interworking mode or an independent mode. That is, a user can operate the outlet 900 in the interworking mode or the independent mode through the mode selector 1005.

For example, when the outlet 900 is operated in the interworking mode, the controller 1001 discriminates whether the electronic product connected to the outlet 900 is a master electronic product or a slaver electronic product. Accordingly, when power supplied to the master electronic product is interrupted, the controller 1001 can automatically interrupt power supplied to the slaver electronic product interworked with the master electronic product. For example, when a computer and a peripheral device are interworked and then used or a home theater is used, the computer or a TV may be a master device and other peripheral devices may be slaver devices. Accordingly, when a power source of a computer or a TV connected to the outlet 900 is turned "off", the standby power interrupter 1003 interrupts power supplied to the plug inserter 901 into which a plug of the computer or the TV is inserted. At the same time, power supplied to the peripheral devices interworked with the master device is also interrupted. That is, the standby power interrupter 1003 corresponding to the peripheral devices interrupts power supplied to the corresponding plug inserter 901.

When the outlet 900 is independently operated, the one or more standby power interrupters 1003 corresponding to the one or more plug inserters 901 are independently operated.

That is, the one or more standby power interrupters 1003 are independently operated regardless of a state of the power source of the master electronic product.

Meanwhile, when the outlet 900 is hidden by furniture and thus it is not possible to press the knob 219 of the outlet switch unit 280, an installation of the separate remote switch unit 903 is required. That is, the remote switch unit 903 includes a switch, an infrared reception sensor (IR), or an LED device, and may be installed in a place having an easy access by the user. The LED device of the remote switch unit 903 indicates that the outlet 900 is in a sleep mode or a normal mode.

When the user turns "on" a switch or a remote control of the remote switch unit 903 in order to operate the outlet apparatus 900, the remote switch unit 903 outputs a predetermined control signal to the controller 1001. At this time, the controller converts the standby power interrupter 1003 in an "off" state among the one or more standby power interrupters 1003 to the standby power interrupter 1003 in an "on" state, and supplies power to the electronic product corresponding to the one or more standby power interrupters 1003 in the "on" state converted from the "off" state. In general, the user can use the remote switch unit 903 in order to turn "on" the outlet apparatus 900.

Hereinafter, a construction and an operation of the outlet switch unit 280 will be described with reference to the drawings in detail.

Figure 11:
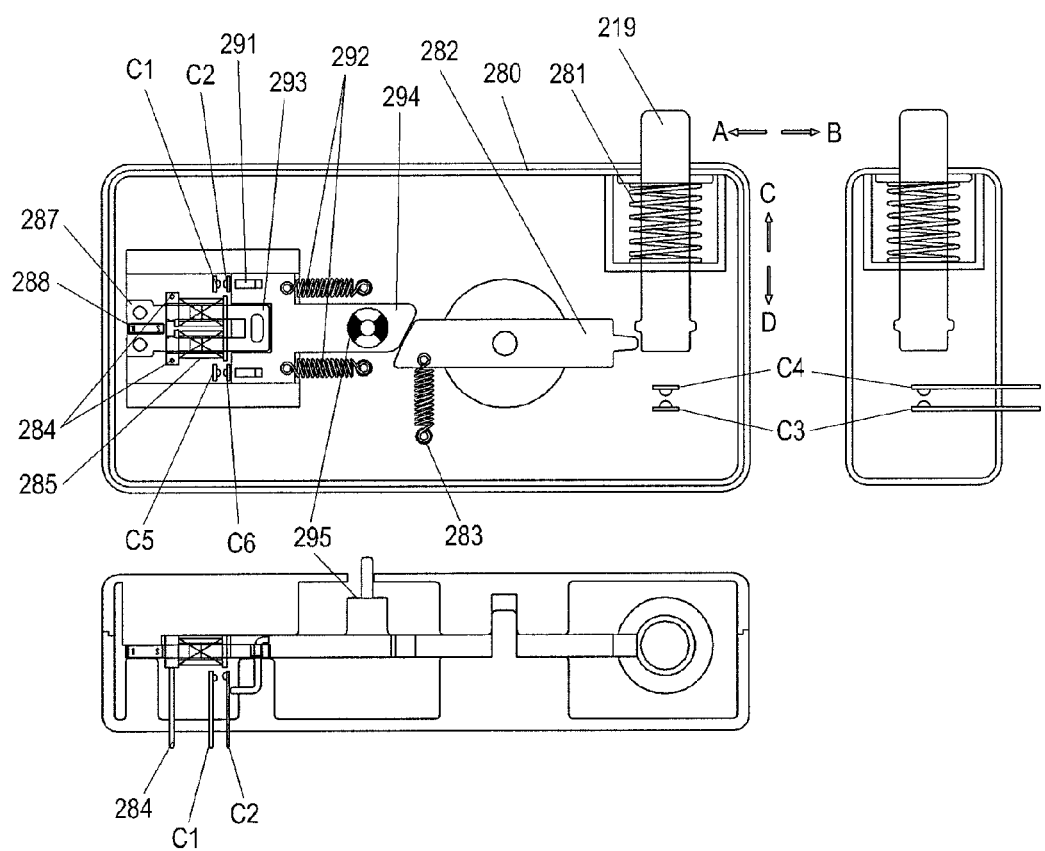
FIG. 11 is a diagram illustrating an outlet switch unit according to a second embodiment of the present invention.

FIG. 11 is a diagram illustrating an outlet switch unit according to a second embodiment of the present invention.

Referring to FIG. 11, the outlet switch unit 280 includes the knob (or knob switch) 219, the knob switch 281, the lever 282, the lever spring 283, the solenoid coil terminal 284, the contact 1 C1, the contact 2 C2, the core 287, the magnet 288, the solenoid coil 285, the stroke 291, the cam 294, the slide 293, the cam spring 292, the cam knob 295, the contact 3 C3, the contact 4 C4, the contact 5 C5, and the contact 6 C6. Here, the cam 294, the slide 293, the stroke 291, and the cam knob 295 may be integrally constructed.

An overall operation of the outlet switch unit 280 according to embodiments of the present invention is similar to the operation according to the first embodiment of the present invention. Accordingly, hereinafter, operation of the outlet switch unit 280 differing from the aforementioned operation of the outlet switch unit 280 will be mainly described. Further, hereinafter, an operation of the outlet switch unit 280 according to the second embodiment of the present invention and an operation of the outlet 900 including the outlet switch unit 280 will be described.

First, when a user desires to operate the outlet 900, the user presses the knob 219 of the outlet switch unit 280 and thus the contacts C1 and C2, the contacts C3 and C4, and the contacts C5 and C6 are connected. When the user presses and releases the knob switch 219, the knob switch 219 is returned to an original position by the knob spring 281. Accordingly, the contact C3 and the contact C4 are connected and then separated. Meanwhile, the contacts C1 and C2, and the contacts C5 and C6 are maintained in a connection state.

Specifically, when the user presses the knob 219 of the outlet switch 280 in a direction D and thus the lever 282 is downwardly pushed, the lever 282 is rotated in a clockwise direction and the lever 282 upwardly pushes the cam 294 located in an opposite side. The slide 293 integrally constructed with the cam 294 is moved in the direction A. At this time, the cam spring 292 is extended in the direction A. The core 287 integrally constructed with the magnet 288 pulls the slide 293 having moved in the direction A with magnetic force. When the core 287 and the slide 293 are attached to each other, the stroke, which is integrally constructed with the cam 294 and formed of an insulation material, is moved in the direction A and thus the contact 1 C1 and the contact 2 C2 are connected and the contact C5 and the contact C6 are connected. When the contacts are connected to each other, the outlet switch unit 280 supplies power to the plug inserter 901.

Further, the user can operate the outlet 900 by using the remote switch unit 903. That is, when the user presses a switch of the remote switch unit 903 or desires to remotely operate the outlet 900 through a remote control, the controller 1001 controls such that a current is applied to solenoid coil terminal 284 of the outlet switch unit 280 in order to convert the standby power interrupter 1003 in an "off" state among the one or more standby power interrupters 1003 within the outlet 900 to a standby power interrupter in an "on" state.

Specifically, when the user presses the switch of the remote switch unit 903 and thus an input I2 of the controller 1001 becomes low, the controller 1001 determines that the corresponding electronic product is being used. Accordingly, the controller 1001 applies a pulse to an output of O91 and transistors Q92 and Q93 of the switch driver 1007 are turned "on". The switch driver 1007 supplies a current to the solenoid of the outlet switch 280 from a direction S to a direction R. When power is supplied to the solenoid coil terminal 284, the solenoid becomes an electromagnet and thus generates attraction with the magnet 288. The core 287 integrally constructed with the magnet 288 pulls the slide 293 with magnetic force. When the core 287 and the slide 293 are attached to each other, the stroke 291, which is integrally constructed with the cam 294 and formed of an insulation material, is moved in the direction A and thus the contact 1 C1 and contact 2 C2 are connected and the contact C5 and the contact C6 are connected.

At this time, when a power source of the electronic product is in an "off" state for a predetermined time, the controller 1001 determines that the electronic product is not used and outputs a pulse to an output of O92 of the controller. That is, the controller outputs a pulse to an output of O92 and turns "on" transistors Q91 and Q94 of the switch driver 1007. The switch driver 1007 supplies power to the solenoid of the outlet switch unit 280 from a direction R to a direction S. When power is supplied to the solenoid coil terminal 284, the solenoid becomes an electromagnet and generates a repulsive force with the magnet 288. Accordingly, the contacts C1 and C2 of the outlet switch unit 280 are separated and the contacts C5 and C6 of the outlet switch unit 280 are separated, and power supplied to the plug inserter 901 is interrupted.

Meanwhile, when a power source of the electronic product is turned "off" while the electronic product is normally operated, a standby current flows in the inside of the electronic product. At this time, the controller 1001 determines whether a current measured by the sensor unit 1008 is equal to a standby current stored in the memory 1009. When it is determined that the current flowing in the inside of the electronic product is the standby current, the controller 1001 controls such that power is supplied to the solenoid coil terminal 284 of the outlet switch unit 280.

When power is supplied to the solenoid coil terminal 284, the solenoid becomes an electromagnet and generates a repulsive force with the magnet 288. Accordingly, the slide 293 attached to the core 287 is moved in the direction B by the cam spring 292 due to the repulsive power with the magnet 288. The cam 294 integrally constructed with the slide 293 is also moved in the direction B and thus the stroke 291 is returned to an original position. When the stroke 291 is moved to the original position, the contact 1 C1 and contact 2 C2 are separated and contact C5 and the contact C6 are separated, and thus AC power coming in the inside of the electronic product is interrupted.

As described above, the outlet according to embodiments of the present invention can automatically interrupt standby power consumed in insides of the electronic product and the outlet apparatus according to a state of a power source of the electronic product connected to one or more plug inserters. Further, the user can conveniently operate the outlet by using the remote switch unit installed in an outside of the outlet apparatus. Furthermore, when power sources of all electronic products connected to one or more plug inserters are in an "off" state, the outlet is operated in a sleep mode and power consumed in the inside of the outlet may be minimized.

While the present invention has been shown and described with reference to certain exemplary embodiments and drawings thereof, it will be understood by those skilled in the art that various changes in form and details may be made therein without departing from the spirit and scope of the invention as defined by the appended claims.

The invention claimed is:

1. An outlet apparatus for interrupting standby power, the outlet apparatus comprising:
    at least one standby power interrupter configured to perform at least one of interrupt external power and supply the external power to an electronic product connected to at least one outlet inserter, the at least one standby power interrupter being installed to correspond to the at least one outlet inserter, respectively;
    an outlet power source unit configured:
        to convert external power input from the at least one standby power interrupter, and
        to supply the converted external power to an inside of the outlet apparatus;
    a mode selector configured to receive an input of a selection mode for operating the outlet apparatus with at least one of an independent mode and an interworking mode; and
    a controller configured:
        to individually set a standby current of the electronic product connected to the at least one outlet inserter,
        to determine a state of a power source of the electronic product connected to the at least one outlet inserter by using the set standby current, and
        to control the at least one standby power interrupter according to the determined state of the power source.

2. The outlet apparatus of claim 1, wherein the outlet power source unit is further configured to convert AC power input from the at least one standby power interrupter to DC power and to supply the converted DC power to drive a circuit within the outlet apparatus.

3. The outlet apparatus of claim 1, further comprising a backup power source unit configured to supply backup power for driving a circuit within the outlet apparatus when a state of the outlet apparatus corresponds to a sleep mode.

4. The outlet apparatus of claim 3, further comprising a remote switch unit configured to control the at least one standby power interrupter remotely or through a switch, the remote switch unit being installed in an outside of the outlet apparatus.

5. The outlet apparatus of claim 1, wherein the at least one standby power interrupter comprises a sensor unit configured to measure a current consumed within the electronic product connected to the at least one outlet inserter and to provide the measured current to the controller.

6. The outlet apparatus of claim 5, further comprising a memory configured to store a standby current of the electronic product connected to the at least one outlet inserter set by the controller.

7. The outlet apparatus of claim 6, wherein the controller is further configured, when a signal is input from a user for a set time:
    to set a current consumed within the electronic product connected to the at least one inserter as a standby current, and
    to store the set current in the memory.

8. The outlet apparatus of claim 6, wherein the controller is further configured:
    to temporarily store a current value measured by the sensor unit in a buffer,
    detect whether the current value is increased, decreased, or maintained, and
    to automatically set a standby current of the electronic product connected to the at least one outlet inserter.

9. The outlet apparatus of claim 8, wherein the controller is further configured:
    to retain data stored in the buffer without any change when the current value measured by the sensor unit is increased,
    to replace the data stored in the buffer with a decreased current value,
    and to store the replaced current value when the current value measured by the sensor unit is decreased, and
    wherein the controller is further configured, when data recorded in the buffer is maintained for a set time without any change, to set a current value recorded in the buffer as the standby current of the electronic product connected to the at least one outlet inserter.

10. The outlet apparatus of claim 1, wherein the controller is further configured, when the outlet apparatus is operated in the interworking mode, to identify whether the electronic product connected to the at least one outlet inserter is a master electronic product, and wherein the controller is further configured to automatically control a power source of a slaver electronic product interworked with a master electronic product according to a state of a power source of the master electronic product when the electronic product connected to the at least one outlet inserter is the master electronic product.

* * * * *